(12) United States Patent
Chen et al.

(10) Patent No.: US 11,508,503 B2
(45) Date of Patent: Nov. 22, 2022

(54) TEXTURED PLANAR M-TYPE HEXAGONAL FERRITES AND METHODS OF USE THEREOF

(71) Applicant: ROGERS CORPORATION, Chandler, AZ (US)

(72) Inventors: Yajie Chen, Brighton, MA (US); Kevin Ring, Billerica, MA (US); Li Zhang, Jiangsu (CN); Michael S. White, Pomfret Center, CT (US)

(73) Assignee: ROGERS CORPORATION, Chandler, AZ (US)

( * ) Notice: Subject to any disclaimer, the term of this patent is extended or adjusted under 35 U.S.C. 154(b) by 870 days.

(21) Appl. No.: 16/378,676

(22) Filed: Apr. 9, 2019

(65) Prior Publication Data

US 2019/0318858 A1 Oct. 17, 2019

Related U.S. Application Data

(60) Provisional application No. 62/656,522, filed on Apr. 12, 2018.

(51) Int. Cl.

| H01F 1/34 | (2006.01) |
| C04B 35/26 | (2006.01) |
| G11B 5/706 | (2006.01) |
| H05K 9/00 | (2006.01) |
| H01F 1/10 | (2006.01) |

(52) U.S. Cl.
CPC ......... *H01F 1/348* (2013.01); *C04B 35/2633* (2013.01); *G11B 5/70678* (2013.01); *H01F 1/10* (2013.01); *H05K 9/0086* (2013.01); *C04B 2235/60* (2013.01); *C04B 2235/605* (2013.01); *C04B 2235/767* (2013.01); *C04B 2235/77* (2013.01); *C04B 2235/787* (2013.01); *C04B 2235/85* (2013.01)

(58) Field of Classification Search
CPC ....... H01F 1/10; H01F 1/348; C04B 35/2633; C04B 2235/767; C04B 2235/77; C04B 2235/787; C04B 2235/60; C04B 2235/605

See application file for complete search history.

(56) References Cited

U.S. PATENT DOCUMENTS

| 3,461,072 A | 8/1969 | Winkler |
| 8,263,224 B2 | 9/2012 | Tokiwa |
| 2009/0101873 A1 | 4/2009 | Tan et al. |
| 2009/0266604 A1 | 10/2009 | Tokiwa |
| 2010/0129540 A1 | 5/2010 | Senkel |
| 2010/0173101 A1* | 7/2010 | Harris ............... C04B 35/62218 427/598 |
| 2013/0063296 A1 | 3/2013 | Hennig et al. |
| 2013/0342414 A1 | 12/2013 | Hong et al. |
| 2014/0291571 A1 | 10/2014 | Hirose |
| 2016/0099498 A1 | 4/2016 | Pance et al. |
| 2016/0113113 A1 | 4/2016 | Sethumadhavan et al. |
| 2016/0118171 A1 | 4/2016 | Hill |
| 2016/0276072 A1 | 9/2016 | Sethumadhavan et al. |
| 2021/0032121 A1 | 2/2021 | Li et al. |
| 2021/0043346 A1 | 2/2021 | Li et al. |

FOREIGN PATENT DOCUMENTS

| EP | 0884740 A1 | 12/1998 |
| EP | 0905718 A1 | 3/1999 |
| JP | H09167703 | 6/1997 |
| JP | 2010238748 A | 10/2010 |
| WO | 2012103020 | 8/2012 |
| WO | 2012103020 A2 | 8/2012 |

OTHER PUBLICATIONS

Allia et al.; "Fe3O4 nanoparticles and nanocomposites and potential application in biomedicine and in communication technologies: Nanoparticle aggregation, interaction, and effective magnetic anisotropy"; J. of Applied Physics 116 113903 (2014) 10 pgs.
Li et al. "High-frequency magnetic properties of W-type barium-ferrite BaZn2—xCoxFe16O27 composites", Journal of Applied Physics 94, 5918 (2003): https://doi.org/10.1063/1.1618945.
Pullar, "Hexagonal Ferrite Fibres and Nanofibres," Trans Tech Publications, 2016, pp. 1-68, vol. 241.
Sahoo et al. Enahnced Magnetoelectricity in Bismuth Substituted SrFe12O19 Hexaferrite, Aug. 2019, Journal of Applied Physics, vol. 126, No. 7.
Singh et al. "Static Magentic Properties of Co and Ru substituted Ba—Sr ferrite," 2008, Materials Research Bulletin, pp. 176-184, vol. 43.
Obol et al.; "Oriented Y-type Hexaferrites for Ferrite Device"; J. Appl. Phys.; 91(10); pp. 7616-7618; (2002).
International Search Report and Written Opinion; International Application No. PCT/US2019/026465; International Filing Date Apr. 9, 2019; dated Jul. 4, 2019; 12 pages.

* cited by examiner

*Primary Examiner* — C Melissa Koslow
(74) *Attorney, Agent, or Firm* — Cantor Colburn LLP

(57) ABSTRACT

A grain-oriented M-type hexagonal ferrite has the formula $MeFe_{12}O_{19}$, and a dopant effective to provide planar magnetic anisotropy and magnetization in a c-plane, or a cone anisotropy, in the hexagonal crystallographic structure wherein Me is $Sr^+$, $Ba^{2+}$ or $Pb^{2+}$, and wherein greater than 30%, preferably greater than 80%, of c-axes of the ferrite grains are aligned perpendicular to the c-plane.

19 Claims, No Drawings

TEXTURED PLANAR M-TYPE HEXAGONAL FERRITES AND METHODS OF USE THEREOF

CROSS-REFERENCE TO RELATED APPLICATIONS

This application claims priority to and the benefit of U.S. Provisional Application 62/656,522 filed on Apr. 12, 2018, which is incorporated herein by reference in its entirety.

BACKGROUND

This disclosure is directed to grain-oriented M-type hexagonal ferrites that have high permeability and low magnetic loss over a broad range of operating frequencies.

Spinel and hexagonal ferrites have considerable potential for use in a variety of low-profile electronic devices, such as perpendicular magnetic records, antennas, microwave absorbers, and electromagnetic interference suppressors. With the increasing market in microwave communications, the magnetic and microwave properties of ferrite compacts or films can be tailored to meet the requirements of diverse applications.

High permeability and low magnetic loss at microwave frequencies will provide materials for the creation of electrically small antennas for electronic communications. The unique magnetodielectric nature of ferrite substrates allows for miniaturization of antenna elements without the subsequent loss of bandwidth that is often observed in high dielectric constant substrates. Magnetodielectric materials thus have great potential for application in the miniaturization of antennas with broad bandwidth, which are widely used in personal mobile phones, base stations, and the like. For example, both microwave antennas and inductors are vital components in advanced microwave communications.

What is needed are novel ferrites with magnetodielectric properties suitable for microwave communication applications and others.

BRIEF SUMMARY

In an aspect, a grain-oriented M-type hexagonal ferrite has the formula $$MeFe_{12}O_{19},$$

and a dopant effective to provide planar magnetic anisotropy and magnetization in a c plane, or an easy cone anisotropy, in the hexagonal crystallographic structure, wherein Me is $Sr^+$, $Ba^{2+}$ or $Pb^{2+}$, and wherein greater than 30%, preferably greater than 80%, of c-axes of the ferrite grains are aligned perpendicular to the c-plane.

In another aspect, included are articles comprising the grain-oriented M-type hexagonal ferrite.

In yet another aspect, a method of making a doped, grain-oriented M-type hexagonal ferrite comprises preparing a plurality of ferrite grains of the formula $$MeFe_{12}O_{19}$$

comprising a dopant effective to provide planar magnetic anisotropy and easy magnetization in a c-plane, or a cone anisotropy, wherein Me is $Sr^+$, $Ba^{2+}$, or $Pb^{2+}$; aligning the plurality of ferrite grains such that greater than 30%, preferably greater than 80% of the c-axes of the ferrite grains are aligned perpendicular to the c-plane, to provide the doped, grain-oriented M-type hexagonal ferrite; and optionally sintering the doped, grain-oriented M-type hexagonal ferrite at a temperature of greater than 800° C., preferably 800-1350° C. to provide a sintered material having a density of at least 85% of a theoretical density, preferably greater than 90% of a theoretical density.

The above-described and other features will be appreciated and understood by those skilled in the art from the following detailed description and appended claims.

DETAILED DESCRIPTION

Described herein are novel grain-oriented M-type hexagonal ferrites which can be used to provide magnetodielectric materials having high permeability and low magnetic loss over a broad range of operating frequencies, such as at the VHF band of 30-1000 MHz and the UHF band at 300-1000 MHz. The materials disclosed herein can have relative permeabilities of greater than or equal to about 80, 100, or even 150 MHz and above, which have not previously been observed for hexagonal ferrite materials.

In an aspect, a grain-oriented M-type hexagonal ferrite has the formula $$MeFe_{12}O_{19},$$

and a dopant effective to provide planar magnetic anisotropy and easy magnetization in a c-plane (i.e., easy basal plane) or easy cone anisotropy, in the hexagonal crystallographic structure, wherein Me is $Sr^+$, $Ba^{2+}$ or $Pb^{2+}$, and wherein greater than 30%, preferably greater than 80%, of grains of the ferrite are aligned along the c-axis of the crystal structure, perpendicular to the c-plane. Grain-oriented hexagonal ferrites are also referred to as textured hexagonal ferrites.

Hexagonal ferrites have a crystalline structure in which the planar axis is referred to as the "a" ($a_1$, $a_2$, $a_3$) axis. The c-plane plane is also referred to as the basal plane. The c-axis is the axis out of the c-plane. A proper dopant or mixture of dopants in a pure $MFe_{12}O_{19}$ structure can readily tailor a magnetic anisotropy from uniaxial c-axis to c-plane or easy cone-plane. As a result, easy magnetization can be modified from c-axis to c-plane or easy cone. At the same time, the c-axis becomes a hard axis, while the c-plane or cone plane is easy magnetization. The inventors have developed M-type hexagonal ferrites with unexpectedly high alignment along the c-axis of the crystal structure while retaining easy magnetization in c-plane or cone plane. In the grain-oriented ferrites, greater than 30%, preferably greater than 80%, of grains of the ferrite are aligned along the c-axis of the crystal structure, perpendicular to the c-plane.

The dopant provides planar magnetic anisotropy, that is, easy magnetization in the c-plane, or an easy cone anisotropy in the crystal. The easy axis is defined as the preferred axis for the magnetization direction. As used herein, an easy cone anisotropy (or cone anisotrophy for short) is an anisotropy for which the stable magnetic state(s) are at an angle around a particular, symmetry axis. The dopant can be a single dopant, or a mixture of dopants. In an aspect, the dopant comprises Co, Ti, Zr, Sn, Ir, Sc, In, Zn, Mg, Cu, Ni, Bi, Al, Ga, La, or a combination thereof. More specifically, the dopant comprises $Co^{2+}/Ti^{4+}$, $Co^{2+}/Zr^{4+}$, $Co^{2+}/Sn^{4+}$, $Co^{2+}/Ir^{4+}$, $Bi^{2+}/Co^{2+}/Ti^{4+}$, $Bi^{2+}/Co^{2+}/Zr^{4+}$, $Bi^{2+}/Co^{2+}/Sn^{4+}$, or a combination thereof.

In an aspect, the dopant replaces at least a portion of the Fe in the grain-oriented M-type hexagonal ferrite.

Specific grain-oriented M-type hexagonal ferrites of the present disclosure include ferrites having the formula: $Bi_x$—$Ba_{1-x}(CoTi)_yFe_{12-2y}O_{19}$ (x=0-0.8, y=0.5-1.5), $Ba(CoTi)_xFe_{12-2x}O_{19}$ (x=0.5-1.5), $Ba(CoZr)_xFe_{12-2x}O_{19}$ (x=0.5-1.5), $Ba(CoSn)_xFe_{12-2x}O_{19}$ (x=0.5-1.5), $Ba(CoIr)_xFe_{12-2x}O_{19}$ (x=0.5-1.5), $Bi_xSr_{1-x}(CoTi)_y$—$Fe_{12-2y}O_{19}$ (x=0-0.8, y=0.5-

1.5), Sr(CoTi)$_x$Fe$_{12-2x}$O$_{19}$ (x=0.5-1.5), Sr(CoZr)$_x$Fe$_{12-2x}$O$_{19}$ (x=0.5-1.5), Sr(CoSn)$_x$Fe$_{12-2x}$O$_{19}$ (x=0.5-1.5), and Pb(CoTi)$_x$Fe$_{12-2x}$O$_{19}$, (x=0.5-1.5). Preferred grain-oriented M-type ferrites include ferrites having the formula Bi$_x$Ba$_{1-x}$(CoTi)$_y$Fe$_{12-2y}$O$_{19}$ (x=0-0.8, y=0.5-1.5), Ba(CoTi)$_x$Fe$_{12-2x}$O$_{19}$ (x=0.5-1.5), Ba(CoZr)$_x$Fe$_{12-2x}$O$_{19}$ (x=0.5-1.5), and Ba(CoSn)$_x$Fe$_{12-2x}$O$_{19}$ (x=0.5-1.5). A specific grain-oriented M-type hexagonal ferrite has the formula (Bi$_x$Sr$_y$Ba$_{1-x-y}$)(CoTi)$_z$Fe$_{12-2z}$O$_{19}$, wherein x is 0-0.8 or 0.05-0.5, y is 0-1 and z is 0.5-2.0. In this specific ferrite, Sr substitutes for a portion of the Ba.

The grain-oriented M-type hexagonal ferrites can have one or more of a number of advantageous properties. Relative permeability is a property indicative of the performance of a magnetic material in high frequency applications, and is a measure of the degree of magnetization of a material that responds linearly to an applied magnetic field relative to that of free species. Relative permeability can be measured by an impedance analyzer over 1-1000 MHz or a Vector network analyzer (VNA) with co-axial airline fixture over 0.5-10 GHz. The grain-oriented M-type hexagonal ferrites can have an in-plane relative permeability of greater than 50, greater than 80, greater than 100, or greater than 150 over an operating frequency of 50 MHz-300 MHz. The grain-oriented M-type hexagonal preferably can have an in-plane relative permeability of greater than 50, greater than 80, greater than 100, or greater than 150 at an operating frequency of 100 MHz.

The magnetic loss tangent, the dielectric loss tangent, and the dielectric constant are also measures of the magnetodielectric properties of a material. The grain-oriented M-type hexagonal ferrites can have a magnetic loss tangent of less than 0.5, or even less than 0.2 at 100 MHz, preferably less than 0.1 at 100 MHz. The magnetic loss tangent can be measured by impedance analyzer or VNA with coaxial airline fixture.

The grain-oriented M-type hexagonal ferrites can have a dielectric loss tangent of less than 0.02 over 0-300 MHz, preferably less than 0.03 at 30-300 MHz. The dielectric loss tangent can be measured by impedance analyzer or VNA with coaxial airline fixture, The grain-oriented M-type hexagonal ferrites can have a dielectric constant of 10-30 over 30-300 MHz, or 6-30 over 300-1000 MHz. The dielectric constant can be measured by an impedance analyzer or a VNA with a coaxial airline fixture.

In an aspect, the grain-oriented M-type hexagonal ferrites have an in-plane relative permeability of greater than 80 at an operating frequency over 50-300 MHz; and a magnetic loss tangent of less than 0.2 at 100 MHz, preferably less than 0.1 at 100 MHz.

In another aspect, the grain-oriented M-type hexagonal ferrites have a magnetic loss tangent of less than 0.5, or less than 0.2 over 30-300 MHz, preferably less than 0.1 over 30-300 MHz; and a dielectric loss tangent of less than 0.05 over 30-300 MHz, preferably less than 0.02 over 30-300 MHz.

In another aspect, the grain-oriented M-type hexagonal ferrites have each of an in-plane permeability of greater than 50 over an operating frequency of 50 MHz-300 MHz or greater than 50 at an operating frequency of 100 MHz; a magnetic loss tangent of less than 0.5 at 100 MHz; a dielectric loss tangent of less than 0.02 over 0-300 MHz; and a dielectric constant of 10-30 over 30-300 MHz, or 6-30 over 300-1000 MHz.

In still another aspect, the grain-oriented M-type hexagonal ferrite have each of an in-plane permeability of greater than 80 over an operating frequency of 50 MHz-300 MHz, or greater than 80 at an operating frequency of 100 MHz; a magnetic loss tangent of less 0.2 at 100 MHz; a dielectric loss tangent of less than 0.03 over 30-300 MHz; and a dielectric constant of 10-30 over 30-300 MHz, or 6-30 over 300-1000 MHz.

In yet another aspect, the grain-oriented M-type hexagonal ferrite has an in-plane permeability of greater than 150 over an operating frequency of 50 MHz-300 MHz, or greater than 150 at an operating frequency of 100 MHz; a magnetic loss tangent of less than 0.1 at 100 MHz; a dielectric loss tangent of preferably less than 0.03 at 30-300 MHz; and a dielectric constant of 6-30 over 300-1000 MHz.

The grain sizes of the grain-oriented M-type hexagonal ferrites in the c-plane (along with a-axis) can be 0.5-2 micrometer (μm), 2-6 μm, 6-20 μm, 20-100 μm, 100-200 μm, or up to 300 μm.

In an aspect, the grain-oriented M-type hexagonal ferrites are sintered. Sintering can be performed at a temperature of greater than 800° C., preferably 800-1350° C. The sintered grain-oriented M-type hexagonal ferrites can have a sintered density of at least 85% of a theoretical density, preferably at least 90% of a theoretical density. The theoretical density is calculated by crystal structure and chemical formulation or x-ray diffraction measurement.

Also included herein are articles comprising the grain-oriented M-type hexagonal ferrites described herein. Exemplary articles include an inductor, a perpendicular magnetic record, an antenna, a microwave absorber, an electromagnetic interference suppressor, or a shielding material, such as shielding materials in wireless power devices and near-field communication. In the case of consumer electronic devices, the doped, grain-oriented M-type hexagonal ferrites are expected to provide improved performance in the presence of the user's hand or head, better absorbed radiation properties, and the like.

Also included herein is a method of making a doped, grain-oriented M-type hexagonal ferrite comprising preparing a plurality of ferrite grains of the formula

MeFe$_{12}$O$_{19}$ comprising a dopant effective to provide planar magnetic anisotropy and easy magnetization in the c-plane, or an easy cone anisotropy, wherein Me is Sr$^+$, Ba$^{2+}$ or Pb$^{2+}$; aligning the plurality of ferrite grains such that greater than 30%, preferably greater than 80% of the c-axes of the ferrite grains are aligned perpendicular to the c-plane, to provide the doped, grain-oriented M-type hexagonal ferrite; and optionally sintering the doped, grain-oriented M-type hexagonal ferrite at a temperature of greater than 800° C., preferably 800-1350° C. to provide a sintered material having a density of at least 85% of a theoretical density, preferably greater than 90% of a theoretical density.

In an aspect, the dopant is provided by substituting a portion of the Fe with CoTi, CoZr or CoSn.

In an aspect, preparing single grains comprises calcining and sintering dry powders, a sol-gel process, a molten salt process, a co-precipitation process, a sol-gel hydrothermal process, a hydrothermal process, or another chemical process. Calcining/sintering dry powders is a conventional ceramic process.

In an example of a conventional ceramic process, BaFe$_{12}$O$_{19}$ powder is prepared by ball milling BaCo$_3$ and Fe$_2$O$_3$ powders followed by calcining at 900-1200° C. The powder is doped with Bi$_2$O$_3$, for example, followed by additional ball milling to incorporate the dopant.

In an exemplary sol-gel process, Ba (or Sr) $Fe_{12}O_{19}$ is prepared by dissolving Ba (or Sr) $(NO_3)_2$ and Fe $(NO_3)_3 \cdot 9H_2O$ in a solvent such as ethylene glycol, followed by dehydration to produce a gel, and calcining to provide the $BaFe_{12}O_{19}$ or $SrFe_{12}O_{19}$ powder.

In an exemplary molten salt process, a molten salt such as a chloride or a sulfate salt is used. A mixture of reactants and salt is heated above the melting temperature of the salt, and product particles form. Upon cooling of the reacted mass, the salt is removed using a solvent for the salt, typically water.

In an exemplary co-precipitation process, a $BaFe_{12}O_{19}$ powder is prepared by mixing iron nitrate and barium acetate powders at a selected $Fe^{3+}/Ba^{2+}$ molar ratio and co-precipitating using NaOH at room temperature. The co-precipitated products are then calcined to provide the hexagonal ferrite.

In an exemplary hydrothermal process, an aqueous suspension containing barium hydroxide and FeOOH is heated slowly to a temperature of 250° C.-325° C. in an autoclave for example, and then cooled to room temperature to provide the hexagonal ferrite.

Any of the hexagonal ferrite powders produced by the foregoing methods can be doped by adding a dopant such as $Bi_2O_3$, for example, followed by ball milling to incorporate the dopant. Alternatively, the dopant can be added during synthesis of the hexagonal ferrite.

In an aspect, aligning the plurality of grains comprises applying a rotating in-plane magnetic field to the grains while applying vertical mechanical pressure to the grains, applying a mechanical shearing force to the grains with or without applying a magnetic field, or a combination thereof. Applying a rotating magnetic field while applying mechanical pressure to the grains provides ferrite powder compaction during the alignment. In a specific aspect, aligning the plurality of grains comprises applying a rotating in-plane magnetic field having a magnetic field has a strength of greater than 2000 Oersted (Oe), preferably greater than 8000 Oe.

In the method of making a doped, grain-oriented M-type hexagonal ferrite, during aligning the plurality of ferrite grains, the method optionally includes shaping the grain-oriented M-type hexagonal ferrite. That is, magnetic field alignment and mechanical pressing can be applied simultaneously to provide a powder compact, typically referred to as a green body. Formation of the green body can be followed by sintering, for example at a temperature of 900-1300° C. for 2-10 hours. Prior to sintering, the green compact can be cut to a specified dimension. The green compact can be sintered in a mold to provide the shape of a component comprising the grain-oriented M-type hexagonal ferrite.

The invention is further illustrated by the following aspects.

Aspect 1: A grain-oriented M-type hexagonal ferrite having the formula $$MeFe_{12}O_{19},$$

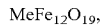

and a dopant effective to provide planar magnetic anisotropy in c-plane, or a cone anisotropy, in the hexagonal crystallographic structure, wherein Me is $Sr^+$, $Ba^{2+}$ or $Pb^{2+}$, and
  wherein greater than 30%, preferably greater than 80%, of grains of the ferrite are aligned along the c-axis of the crystal structure, perpendicular to the c-plane.

Aspect 2: The grain-oriented M-type hexagonal ferrite of aspect 1, wherein the dopant comprises Co, Ti, Zr, Sn, Sc, In, Zn, Mg, Cu, Ni, Bi, Al, Ga, La, or a combination thereof.

Aspect 3: The grain-oriented M-type hexagonal ferrite of aspect 1, wherein the dopant comprises $Co^{2+}/Ti^{4+}$, $Co^{2+}/Zr^{4+}$, $Co^{2+}/Sn^{4+}$, $Bi^{2+}/Co^{2+}/Ti^{4+}$, $Bi^{2+}/Co^{2+}/Zr^{4+}$, $Bi^{2+}/Co^{2+}/Sn^{4+}$, or a combination thereof.

Aspect 4: The grain-oriented M-type hexagonal ferrite of aspect 1, having the formula $Bi_x$—$Ba_{1-x}(CoTi)_yFe_{12-2y}O_{19}$ (x=0-0.8, y=0.5-1.5), $Ba(CoTi)_xFe_{12-2x}O_{19}$ (x=0.5-1.5), $Ba(CoZr)_xFe_{12-2x}O_{19}$ (x=0.5-1.5), $Ba(CoSn)_xFe_{12-2x}O_{19}$ (x=0.5-1.5), $Ba(CoIr)_xFe_{12-2x}O_{19}$ (x=0.5-1.5), $Bi_xSr_{1-x}(CoTi)_y$—$Fe_{12-2y}O_{19}$ (x=0-0.8, y=0.5-1.5), $Sr(CoTi)_xFe_{12-2x}O_{19}$ (x=0.5-1.5), $Sr(CoZr)_xFe_{12-2x}O_{19}$ (x=0.5-1.5), $Sr(CoSn)_xFe_{12-2x}O_{19}$ (x=0.5-1.5), or $Pb(CoTi)_xFe_{12-2x}O_{19}$ (x=0.5-1.5).

Aspect 5: The grain-oriented M-type hexagonal ferrite of aspect 1, having the formula $Bi_xBa_{1-x}(CoTi)_yFe_{12-2y}O_{19}$ (x=0-0.8, y=0.5-1.5), $Ba(CoTi)_xFe_{12-2x}O_{19}$ (x=0.5-1.5), $Ba(CoZr)_xFe_{12-2x}O_{19}$ (x=0.5-1.5), or $Ba(CoSn)_xFe_{12-2x}O_{19}$ (x=0.5-1.5).

Aspect 6: The grain-oriented M-type hexagonal ferrite of aspect 1, wherein Me is $Ba^{2+}$ with substitution of Sr for Ba in part, and having the formula $(Bi_xSr_yBa_{1-x-y})(CoTi)_zFe_{12-2z}O_{19}$ (x=0-0.8, y=0-1, z=0.5-2.0).

Aspect 7: The grain-oriented M-type hexagonal ferrite of any one or more of aspects 1-6, wherein the grain-oriented M-type hexagonal ferrite has at least one of
  an in-plane permeability of
    greater than 50, greater than 80, greater than 100, or greater than 150 over an operating frequency of 50 MHz-300 MHz,
    preferably greater than 50, greater than 80, greater than 100, or greater than 150 at an operating frequency of 100 MHz;
  a magnetic loss tangent of
    less than 0.5, or 0.2 at 100 MHz,
    preferably less than 0.1 at 100 MHz;
  a dielectric loss tangent of
    less than 0.02 over 0-300 MHz,
    preferably less than 0.03 at 30-300 MHz; or
  a dielectric constant that is
    10-30 over 30-300 MHz, or
    6-30 over 300-1000 MHz.

Aspect 8: The grain-oriented M-type hexagonal ferrite of aspect 7, wherein the grain-oriented M-type hexagonal ferrite has
  a magnetic loss tangent of less than 0.2 over 30-300 MHz, preferably less than 0.1 over 30-300 MHz; and
  a dielectric loss tangent of less than 0.05 over 30-300 MHz, preferably less than 0.02 over 30-300 MHz.

Aspect 9: The grain-oriented M-type hexagonal ferrite of aspect 7, wherein the grain-oriented M-type hexagonal ferrite has
  an in-plane permeability of greater than 80 at an operating frequency over 50-300 MHz; and
  a magnetic loss tangent of less than 0.2 at 100 MHz, preferably less than 0.1 at 100 MHz.

Aspect 10: The grain-oriented M-type hexagonal ferrite of any one or more of aspects 1-9, wherein the hexagonal ferrite has a sintered density of at least 85% of a theoretical density, preferably at least 90% of a theoretical density.

Aspect 11: The grain-oriented M-type hexagonal ferrite of any one or more of aspects 1-10, wherein the grain size in the c-plane is 0.5-2 μm, 2-6 μm, 6-20 μm, 20-100 μm, 100-200 μm, or up to 300 μm.

Aspect 12: An article comprising the grain-oriented M-type hexagonal ferrite of any one or more of aspects 1-11.

Aspect 13: The article of aspect 12, wherein the article is an inductor, a perpendicular magnetic record, an antenna, a microwave absorber, an electromagnetic interference suppressor, or a shielding material.

Aspect 14: A wireless power device or near-field communication device comprising the shielding material of aspect 13.

Aspect 15: A method of making a doped, grain-oriented M-type hexagonal ferrite of any one or more of aspects 1-11, the method comprising
preparing a plurality of ferrite grains of the formula $$MeFe_{12}O_{19}$$

comprising a dopant effective to provide planar magnetic anisotropy in the c-plane and easy magnetization in the c-plane, or an easy cone anisotropy, wherein Me is $Sr^+$, $Ba^{2+}$ or $Pb^{2+}$;
aligning the plurality of ferrite grains such that greater than 30%, preferably greater than 80% of the ferrite grains are aligned along the c-axis of the crystal structure perpendicular to the c-plane, to provide the doped, grain-oriented M-type hexagonal ferrite; and
optionally sintering the doped, grain-oriented M-type hexagonal ferrite at a temperature of greater than 800° C., preferably 800-1350° C. to provide a sintered material having a density of at least 85% of a theoretical density, preferably greater than 90% of a theoretical density.

Aspect 16: The method of aspect 15, wherein the dopant is provided by substituting a portion of the Fe with CoTi, CoZr, or CoSn.

Aspect 17: The method of any one of more of aspects 15 and 16, wherein preparing single grains comprises calcining and sintering dry powders, a sol-gel process, a molten salt process, a co-precipitation process, a hydrothermal process, or a chemical synthesis process.

Aspect 18: The method of any one or more of aspects 15-17, wherein aligning the plurality of grains comprises applying a rotating in-plane magnetic field to the grains while applying vertical mechanical pressure to the grains, applying a mechanical shearing force to the grains with or without applying a rotating magnetic field, or a combination thereof.

Aspect 19: The method of aspect 18, wherein aligning the plurality of grains comprises applying a rotating in-plane magnetic field having a magnetic field has a strength of greater than 2000 Oe, preferably greater than 8000 Oe.

Aspect 20: The method of any one or more of aspects 15-19, comprising, during aligning the plurality of ferrite grains, shaping the grain-oriented M-type hexagonal ferrite.

Aspect 21: The method of any one or more of aspects 15-20, comprising, prior to sintering, cutting the grain-oriented M-type hexagonal ferrite to a specified dimension.

In general, the compositions, methods, and articles can alternatively comprise, consist of, or consist essentially of, any ingredients, steps, or components herein disclosed. The compositions, methods, and articles can additionally, or alternatively, be formulated, conducted, or manufactured so as to be devoid, or substantially free, of any ingredients, steps, or components not necessary to the achievement of the function or objectives of the claims.

The use of the terms "a" and "an" and "the" and similar referents (especially in the context of the following claims) are to be construed to cover both the singular and the plural, unless otherwise indicated herein or clearly contradicted by context. The term "or" means "and/or" unless otherwise indicated herein or clearly contradicted by context. The terms "comprising", "having", "including", and "containing" are to be construed as open-ended terms (i.e., meaning "including, but not limited to") unless otherwise noted. A "combination thereof" is an open term that includes at least one of the named elements, optionally together with one or more like elements not named.

Recitation of ranges of values are merely intended to serve as a shorthand method of referring individually to each separate value falling within the range, unless otherwise indicated herein, and each separate value is incorporated into the specification as if it were individually recited herein. The endpoints of all ranges are included within the range and independently combinable. All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

While the invention has been described with reference to an exemplary embodiment, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Any combination of the above-described elements in all possible variations thereof is encompassed by the invention unless otherwise indicated herein or otherwise clearly contradicted by context.

The invention claimed is:

1. A grain-oriented M-type hexagonal ferrite having the formula $$MeFe_{12}O_{19},$$

and a dopant effective to provide planar magnetic anisotropy and magnetization in a c-plane, or a cone anisotropy, in the hexagonal crystallographic structure, wherein Me is $Sr^+$, $Ba^{2+}$ or $Pb^{2+}$, and
wherein greater than 30% of grains of the ferrite are aligned along the c-axis of the crystal structure, perpendicular to the c-plane;
wherein the dopant comprisese $Co^{2+}/Ti^{4+}$, $Co^{2+}/Zr^{4+}$, $Co^{2+}/Sn^{4+}$, $Co^{2+}/Ir^{4'}$, $Bi^{2+}/Co^{2+}/Ti^{4+}$, $Bi^{2+}/Co^{2+}/Zr^{4+}$, $Bi^{2+}/Co^{2+}/Sn^{4+}$, or a combination thereof.

2. The grain-oriented M-type hexagonal ferrite of claim 1, having the formula $Bi_x$—$Ba_{1-x}(CoTi)_yFe_{12-2y}O_{19}$ (x=0-0.8, y=0.5-1.5), $Ba(CoTi)_xFe_{12-2x}O_{19}$ (x=0.5-1.5), $Ba(CoZr)_xFe_{12-2x}O_{19}$ (x=0.5-1.5), $Ba(CoSn)_xFe_{12-2x}O_{19}$ (x=0.5-1.5), $Ba(CoIr)_xFe_{12-2x}O_{19}$ (x=0.5-1.5), $Bi_xSr_{1-x}(CoTi)_y$—$Fe_{12-2y}O_{19}$ (x=0-0.8, y=0.5-1.5), $Sr(CoTi)_xFe_{12-2x}O_{19}$ (x=0.5-1.5), $Sr(CoZr)_xFe_{12-2x}O_{19}$ (x=0.5-1.5), $Sr(CoSn)_xFe_{12-2x}O_{19}$ (x=0.5-1.5), or $Pb(CoTi)_xFe_{12-2x}O_{19}$ (x=0.5-1.5).

3. The grain-oriented M-type hexagonal ferrite of claim 1, having the formula $Bi_xBa_{1-x}(CoTi)_yFe_{12-2y}O_{19}$ (x=0-0.8, y=0.5-1.5), $Ba(CoTi)_xFe_{12-2x}O_{19}$ (x=0.5-1.5), $Ba(CoZr)_xFe_{12-2x}O_{19}$ (x=0.5-1.5), or $Ba(CoSn)_xFe_{12-2x}O_{19}$ (x=0.5-1.5).

4. The grain-oriented M-type hexagonal ferrite of claim 1, wherein Me is $Ba^{2+}$ with substitution of Sr for Ba in part, and having the formula $(Bi_xSr_yBa_{1-x-y})(CoTi)_zFe_{12-2z}O_{19}$ (x=0-0.8, y=0-1, z=0.5-2.0).

5. The grain-oriented M-type hexagonal ferrite having the formula $MeFe_{12}O_{19}$, and a dopant effective to provide planar magnetic anisotropy and magnetization in a c-plane, or an easy cone anisotropy, in the hexagonal crystallographic structure, wherein Me is $Sr^{2+}$, $Ba^{2+}$ or $Pb^{2+}$, and
wherein greater than 30% of grains of the ferrite are aligned along the c-axis of the crystal structure, perpendicular to the c-plane,
wherein the grain-oriented M-type hexagonal ferrite has at least one of
an in-plane permeability of greater than 50 over an operating frequency of 50 MHz-300 MHz;
a magnetic loss tangent of less than 0.5 at 100 MHz;
a dielectric loss tangent of less than 0.02 over 0-300 MHz; or
a dielectric constant that is 10-30 over 30-300 MHz.

6. The grain-oriented M-type hexagonal ferrite of claim 5, wherein the grain-oriented M-type hexagonal ferrite has
a magnetic loss tangent of less than 0.2 over 30-300 MHz; and
a dielectric loss tangent of less than 0.05 over 30-300 MHz.

7. The grain-oriented M-type hexagonal ferrite of claim 5, wherein the grain-oriented M-type hexagonal ferrite has
an in-plane permeability of greater than 80 at an operating frequency over 50-300 MHz; and
a magnetic loss tangent of less than 0.2 at 100 MHz.

8. The grain-oriented M-type hexagonal ferrite of claim 1, wherein the hexagonal ferrite has a sintered density of at least 85% of a theoretical density.

9. The grain-oriented M-type hexagonal ferrite of claim 1, wherein the grain size in the c-plane is up to 300 μm.

10. An article comprising the grain-oriented M-type hexagonal ferrite of claim 1.

11. The article of claim 10, wherein the article is an inductor, a perpendicular magnetic record, an antenna, a microwave absorber, an electromagnetic interference suppressor, or a shielding material.

12. A wireless power device or near-field communication device comprising the shielding material of claim 11.

13. A method of making a doped, grain-oriented M-type hexagonal ferrite of claim 1, the method comprising
preparing a ferrite of the formula $MeFe_{12}O_{19}$ comprising a dopant effective to provide planar magnetic anisotropy and magnetization in the c-plane, or a cone anisotropy, wherein Me is $Sr^+$, $Ba^{2+}$ or $Pb^{2+}$;
aligning the ferrite such that greater than 30% of grains of the ferrite are aligned along the c-axis of the crystal structure perpendicular to the c-plane, to provide the doped, grain-oriented M-type hexagonal ferrite; and
optionally sintering the doped, grain-oriented M-type hexagonal ferrite at a temperature of greater than 800° C. to provide a sintered material having a density of at least 85% of a theoretical density;
wherein the dopant comprises $Co^{2+}/Ti^{4+}$, $Co^{2+}/Zr^{4+}$, $Co^{2+}/Sn^{4+}$, $Co^{2+}/Ir^{4+}$, $Bi^{2+}/Co^{2+}/Ti^{4+}$, $Bi^{2+}/Co^{2+}/Zr^{4+}$, $Bi^{2+}/Co^{2+}/Sn^{4+}$, or a combination thereof.

14. The method of claim 13, wherein the dopant is provided by substituting a portion of the Fe with CoTi, CoZr, or CoSn.

15. The method of claim 13, wherein preparing the ferrite comprises calcining a dry powder comprising a $MeFe_{12}O_{19}$ precursor, a sol-gel process, a molten salt process, a co-precipitation process, a hydrothermal process, a sol gel hydrothermal process, or another chemical synthesis process.

16. The method of claim 13, wherein aligning the ferrite comprises applying a rotating in-plane magnetic field to the ferrite while applying vertical mechanical pressure to the ferrite, applying a mechanical shearing force to the ferrite with or without applying a magnetic field applied, or a combination thereof.

17. The method of claim 16, wherein aligning the ferrite comprises applying a rotating in-plane magnetic field having a magnetic field has a strength of greater than 2000 Oe.

18. The method of claim 13, comprising, during aligning the ferrite, shaping the grain-oriented M-type hexagonal ferrite.

19. The method of claim 13, comprising, prior to sintering, cutting the grain-oriented M-type hexagonal ferrite to a specified dimension.

* * * * *